United States Patent [19]

Wittkower

[11] Patent Number: 4,628,209
[45] Date of Patent: Dec. 9, 1986

[54] PARTICLE IMPLANTATION APPARATUS AND METHOD

[75] Inventor: Andrew Wittkower, Rockport, Mass.

[73] Assignee: Eaton Corporation, Cleveland, Ohio

[21] Appl. No.: 742,492

[22] Filed: Jun. 7, 1985

[51] Int. Cl.⁴ .................. A61K 27/02; G21K 5/00; H01J 37/00
[52] U.S. Cl. .................. 250/492.2; 250/442.1
[58] Field of Search .............. 250/492.21, 397, 442.1

[56] References Cited

U.S. PATENT DOCUMENTS 4,228,358 10/1980 Ryding .
4,234,797 11/1980 Ryding .
4,419,584 12/1983 Benveniste .
4,517,465 5/1985 Gault et al. .............. 250/492.21
4,587,433 5/1986 Farley .............. 250/492.21

OTHER PUBLICATIONS

A New Dose Control Technique for Ion Implantation—Ryding et al.

The Effect of Ion Implanter Design Upon Implant Uniformity—Wittkower.

*Primary Examiner*—Craig E. Church
*Assistant Examiner*—T. N. Grigsby
*Attorney, Agent, or Firm*—C. H. Grace; F. M. Sajovec

[57] ABSTRACT

Method and apparatus for obtaining absolute spatial intensity distribution of a beam of particles in ion implanters. The invention is particularly applicable to ion implanters in which device wafers are mounted on the face of a disk which is rotated, and may be translated, in front of an implanting beam. A spiral pattern of appropriately shaped holes is formed in a spinning disk that holds the wafers. The fluence density of the beam passing through each hole is a precise measure of the fluence density of the particles striking the device wafer at the radial position of the hole. Thus, a measure of the absolute number of particles, and the spatial distribution of those particles is obtained. The invention is useful for beam diagnostics, for quality control of the implantation and for the control over variable intensity implanted ions.

14 Claims, 10 Drawing Figures $\langle I_f \rangle \propto I_f$

PARTICLE IMPLANTATION APPARATUS AND METHOD

DESCRIPTION

1. Technical Field

The present invention relates to particle beam equipment in general and more specifically to method and apparatus for monitoring ion beam intensity.

2. Background Art

In ion implantation a beam of particles is directed at a workpiece to treat the workpiece. One technique for doping semiconductor wafers, for example, is to direct charged doping particles at the wafers to produce a desired doping concentration in the wafer. The wafers are supported on a surface which is moved at high speed along a scanning direction and at a slower speed along an orthogonal control direction in a way to uniformly dope the wafers.

Ion implanters are also used for a variety of other device fabrication needs including ion beam mixing, resist exposure through masks, and ion implantation to change the properties of the surfaces of materials. In most of these applications, there is a need for a precise distribution of fluence densities over the device area and usually a uniform fluence density is needed. (Fluence is the flux integrated over time; i.e. the total number of particles. Fluence density is the flux density integrated over time; that is the total number of particles per unit area.)

In general it is necessary to control the implantation intensity to attain a desired dose and uniformity. It is likely that as ion implantation technology advances, there will be an increased demand for greater uniformity of implant, for more precise knowledge of the number of ions implanted, and for tailored implantation profiles in a given application.

In the prior art several different techniques have been used to control the dose of ions implanted and the uniformity of the density of the implantation. The intensity of a beam striking an electrically isolated workpiece has been measured by detecting the current flow to or from a wafer support element (e.g., Robertson U.S. Pat. No. 3,778,626). Ko et al U.S. Pat. No. 4,011,449 measures both the support element current and the intensity of particles scattered from the workpiece.

A significantly improved beam monitor device is disclosed in U.S. Pat. No. 4,234,797 to Ryding which is expressly incorporated herein by reference. In accordance with the Ryding invention, a radial slot is formed in a workpiece support. The radial length of the slot is somewhat greater than the radial extent of workpieces mounted on either side of the slot. A beam detector (e.g. a Faraday cage) behind the support element is aligned with the slot as it traverses the beam. The beam intensity per unit area transmitted through the slot is essentially the same as the intensity per unit area striking the workpiece.

In the preferred method of ion implantation of large workpieces, the ion beam is scanned repeatedly over the workpiece. In a common scanning mode, the workpiece is rotated and translated to obtain the desired dose and uniformity. The beam current measured through practice of the Ryding invention is used to maintain a constant intensity per unit area by controlling the velocity of the scan of the workpiece in the direction of the slot.

The Ryding invention is not a profile monitor. It measures the time evolution of the beam but does not measure the radial distribution of the beam intensity within the beam cross section. Prior art beam profile measuring devices that do measure the beam intensity distribution make use of devices which intercept the beam before it reaches the workpiece. Such devices (usually a rotating wire loop) either measure the direct beam intensity which strikes it or measure the intensity of a component of the beam which is scattered by an intercepting device. Both methods are impractical for use in ion implanters since the ion beam path to the workpiece must be free of interfering structures which might contaminate the workpiece by outgasing or sputtering.

DISCLOSURE OF INVENTION

The present invention relates to an improved apparatus for monitoring particle beam profile and/or for controlling ion implantation. The invention is used to profile the beam during set-up and diagnostics of implantation equipment and it is also used as a beam profiler during implantation to monitor and control beam dose.

The apparatus of the invention includes a support for mounting one or more devices for rotation through a beam. The support defines a number of apertures at different distances from a support axis of rotation. These apertures allow beam particles to pass through the support so that a measuring device can monitor characteristics of particles passing through the apertures. In one embodiment, as the support rotates, it is moved relative to the beam so that the beam is directed to different regions of the support and passes through different ones of the support apertures.

The apertures preferably define a spiral pattern about the support. In an application where semiconductor wafers are doped, for example, the circumferential spacing between apertures is chosen to equal the center to center spacing between wafers. As the ion beam is directed to the spinning support, the beam impinges on a wafer, then a region of the support which defines an aperture, then another wafer, etc.

After passing through an aperture, a beam analyzer determines the beam intensity. This information is used to adjust the beam during set up of the apparatus and can also be used to control relative movement between the beam and the support during ion implantation.

One object of the invention is thus, to provide method and apparatus for providing a measure of the spatial distribution of beam particles directed along a beam path. Other objects, advantages and features of the invention will become clear as a detailed description of a preferred embodiment of the invention is discussed in conjunction with the accompanying drawings.

BEST MODE FOR CARRYING OUT THE INVENTION

Figure 1:
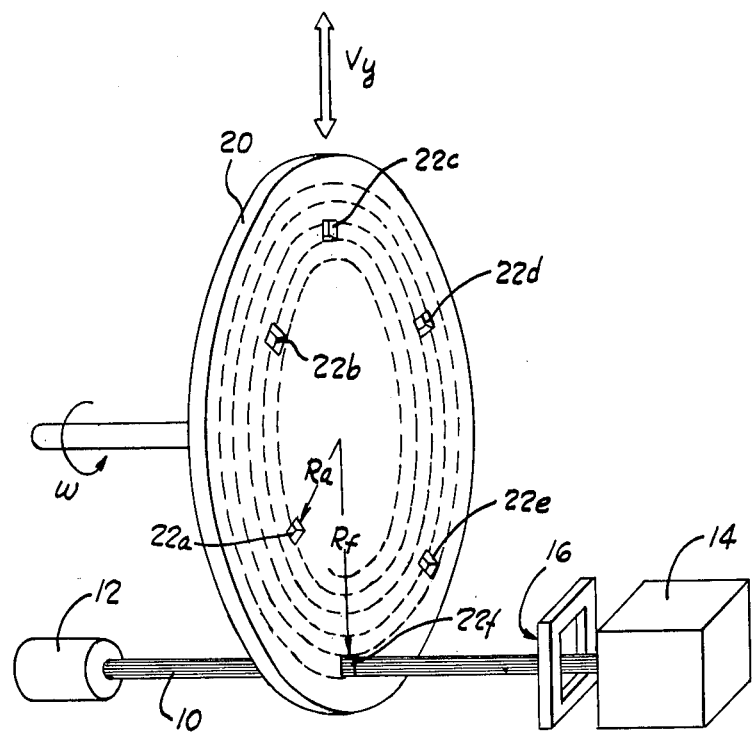
FIG. 1 is a schematic perspective view of the apparatus of the invention.

The elements of the invention are shown schematically in FIG. 1. The intensity I of an ion beam 10 generated by a source 12 is measured by a Faraday cage 14 having a resolving aperture 16 greater than the beam cross section.

Intercepting the beam is a disk 20, which spins with a rotational frequency w/2 and which is translated back and forth across the beam 10 at a speed, $v_T = \Delta R w / 8\pi$, where $\Delta R$ is the radial extent of the beam impingement on the disk 20. The translation velocity $v_T$ in this embodiment is about 1% of the angular speed wR.

Figure 2:
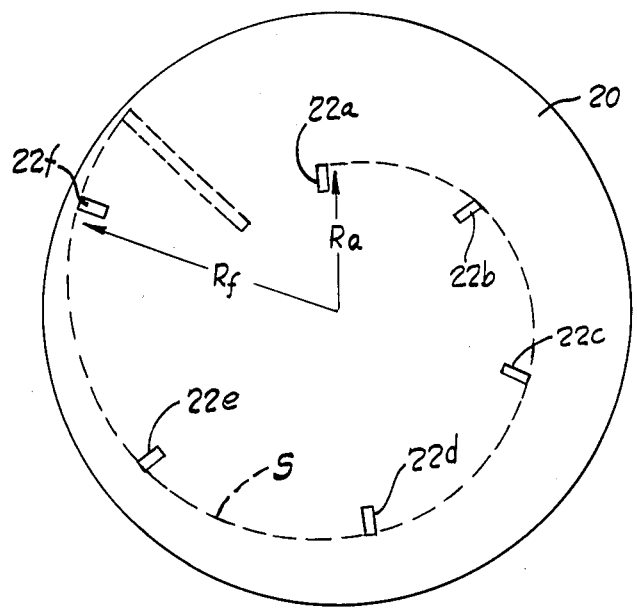
FIG. 2 is a plan view of a workpiece support showing the spacial distribution of apertures for determining a beam profile.

The stationary beam 10 traces out a spiral path on the disk. Six equally spaced slots 22a-22f of the same dimensions are cut in the disk 20. The slots are arranged in a spiral S configuration as illustrated in FIG. 2. The inner radius of the outermost slot 22a is equal to the outer radius of the next slot 22b in the spiral. The inner radius of each slot is equal to the outer radius of the next inward slot.

As the disk spins and translates, the slots traverse the beam in turn. Whenever a slot traverses the beam path, the Faraday cage 14 measures the current which is transmitted through the slot. The instantaneous current, $I_F$, measured by the Faraday cage 14 during each slit traversal will be the same if the incident current I is constant. The time width of the current pulses obtained for a given traversal will vary directly with the mean radii of the slots, e.g. $R_f$ or $R_a$ of FIGS. 1 and 2. The average current over one cycle, $<I_F> = SI_F/(2\pi R_i)$, where S is the slit width and $R_i$ is the radius of the slit, is proportional to the total charge through the slit and is therefore proportional to the total implantation dose on the area of the slit during one revolution.

In the embodiment illustrated in FIGS. 1 and 2, the inner and outer radii of the slits are chosen so that the six slits provide an eqivalent sampling to an imagined single slit 24 (FIG. 2). The control of the beam current to produce a uniform implantation dose is the same as that of Ryding, U.S. Pat. No. 4,234,797, wherein the average current in the Faraday cage is used to control the transverse velocity $v_T$ so as to maintain a uniform dose D of implant through the area of the workpiece. The control is carried out according to the relation $$v_T = 6.24 \times 10^{18} <I_F> 2N(SD)^{-1}, \quad (1)$$

where N is the number of back and forth motions of the disk. In addition to controlling beam dose uniformity the present invention can be used to give a precise measure of the fine structure of the radial and azimuthal distributions of implantation beam intensity. Accurate information of the dose distribution is important to achieve precise quality control of ion implantation. Non-uniformities in the spatial distribution of the beam intensity can result in non-uniform implantations. The measurement of the spatial uniformity is therefore important for tuning the equipment prior to implanting in workpieces and for monitoring and controlling the beam during the implantation.

Figure 3:
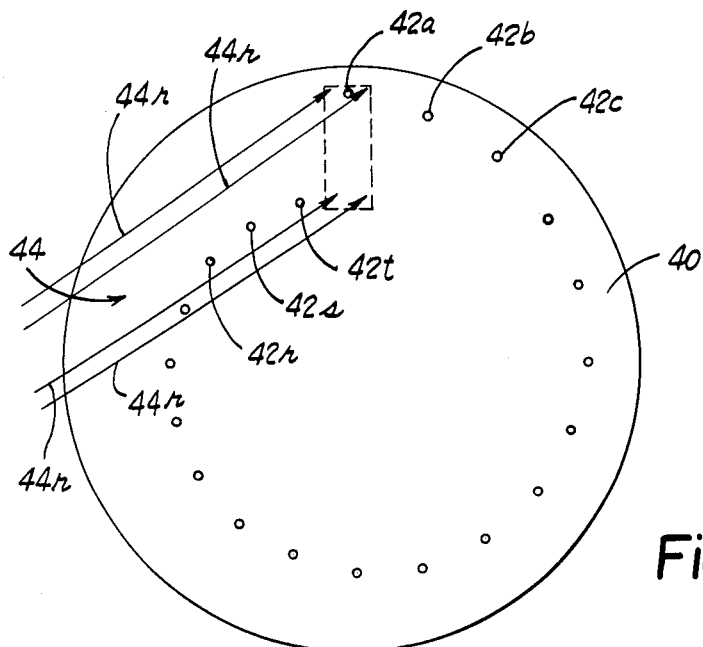
FIG. 3 is a plan view of a support with an alternate aperture configuration.

FIGS. 3 and 4 illustrate the use of the invention for tuning ion beam implantation equipment. To carry out the beam adjustments in a direct and quantitative manner requires detailed profile information of the beam under identical conditions as that of an implantation. To provide this information, a disk 40, 12.75" in radius, is provided with 20, 0.1" diameter holes 42a-42t spaced in a spiral pattern. The outermost hole extends outside the outer limit of a beam 44 defined by beam rays 44r and the inner hole extends inside the inner limit of the beam rays. The remaining 18 holes are placed in a spiral pattern in which each successive hole, in the clockwise direction starting with hole in FIG. 4, is at a radius which is one hole diameter less than that of its predecessor. In this embodiment, the first three holes 42a, 42b, 42c are at radii of 11.75", 11.65" and 11.55" respectively. The last three holes 42r, 42s, 42t are at radii of 10.05", 9.95" and 9.85" respectively. The holes are spaced 18° (about 3.4") apart so their spacing is greater than the width of the ion beam. In this embodiment the disk 40 rotates but does not translate. The 20 holes in the disk cover somewhat more than the extent of the beam as indicated by rays 44r. As the disk spins in front of the Faraday cup 14, the current observed in the Faraday cup measures the beam intensity passing through each of the holes.

Figure 4A:
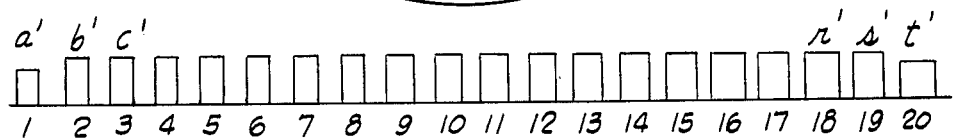
FIGS. 4A–4C show beam intensity information available by monitoring the beam after it passes through the FIG. 3 aperture distribution.
Figure 4B:
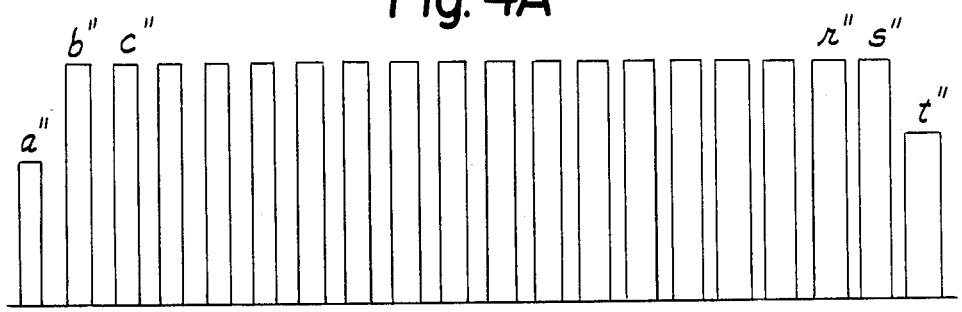

FIG. 4 shows idealized Faraday cup intensity patterns versus time. The current signal $I_F$ versus time after the first revolution of the disk is illustrated in the FIG. 4A. The intensity profile of the beam through holes 42a of FIG. 3 is labeled a' in FIG. 4. The digitized current amplitudes can be sorted electronically into accumulated bins corresponding to the summed intensities through the individual holes. Such an output is illustrated in FIG. 4B for the sum of five disk revolutions.

The intensity pattern as a function of time contains a complete profile of the beam 44. The current amplitude versus time, e.g., for a single pass of a hole gives the angular intensity as a function of time at the radial position of the hole. Successive intensity profiles measure time variations of the flux through each hole.

Figure 4C:
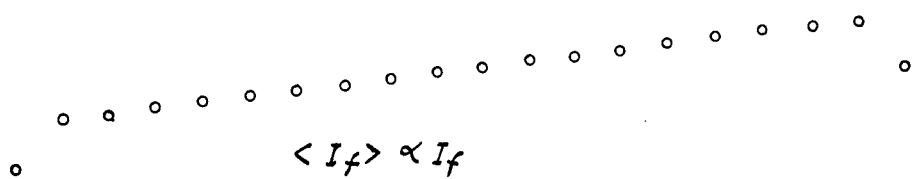

The sum of the successive intensity measurements (FIG. 4B) yields the total flux at the radial position of each hole of FIG. 3. The variation in the current pulses for the 20 holes gives the radial distribution of the beam over short times, e.g. one revolution, FIG. 4A, or summed over many revolutions of the disk, e.g. FIG. 4B. The integral of each ith current pulse, $I_F S(wR_i) - 1$, is proportional to the time averaged current in one revolution $<I_F>$. The implantation dose density per revolution obtained from the profiles of FIG. 4B is shown in FIG. 4C. The integrated sum of all intensities yields the total dose.

The spiral ion beam profiler of FIG. 3 is especially appropriate and practical as an element of a commercial ion beam implantation device. As an active element in the implantation equipment it can be used to monitor the beam during the implant, certify the implantation dose and implantation uniformity for each set of wafers. It can be used to directly and accurately control the beam characteristics by using the measured average beam current, e.g. FIG. 4C, to produce a suitable feedback signal on the beam controllers in order to obtain the desired distribution of implanted ions.

Figure 5:
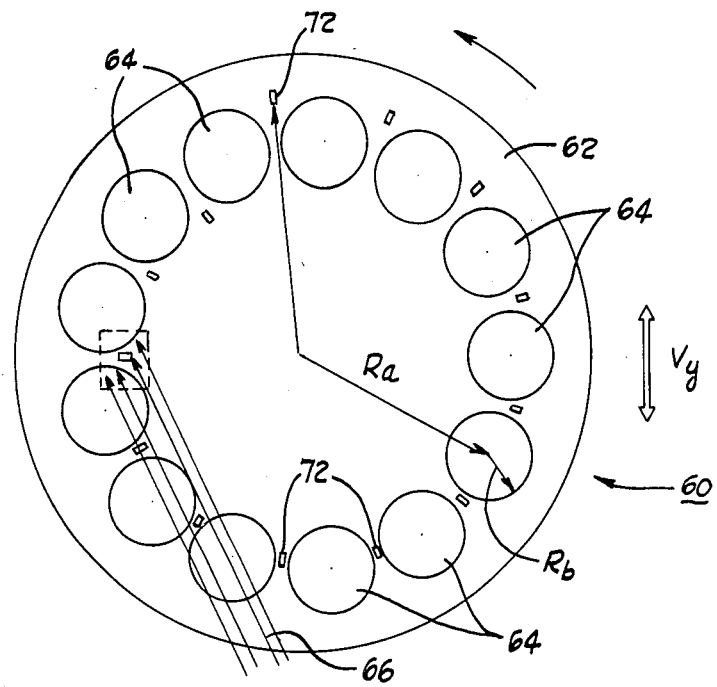
FIG. 5 is a plan view of a wafer support with wafers in place.
Figure 7:
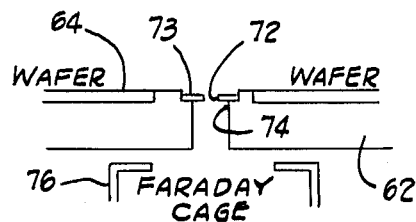
FIGS. 6 and 7 are schematic elevation views of the wafer support in relation to a Faraday cage.
Figure 6:
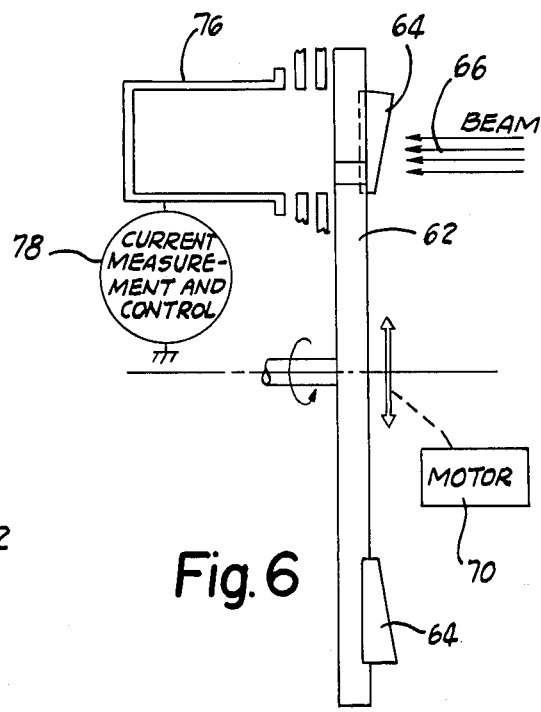

A spiral profiler/monitor/controller 60 is shown in FIGS. 5 and 6. In this embodiment, a disk 62 holds 13 semiconductor wafers 64, e.g., each of mean radius $R_b = 50$ mm, on a mean radius $R_a = 23.6$ cm; the wafers are on inclines of 7° with respect to a beam 66 (see FIG. 6).

The disk is rotated at 800 rpm and translated back and forth with velocity $v_Y$ perpendicular to the beam direction so that the beam is swept over the full 100 mm wafer in 4 sec. The disk 62 is translated by a motor 70 shown schematically in FIG. 6 about 2 mm during each revolution, a distance small compared to the width of the beam 66. The beam 66 thus makes numerous overlapping passes over each wafer 64 during a given implantation.

Thirteen rectangular slots 72, each having an opening of 8 mm×2 mm, in thin tungsten sheets 73, are placed in disk holes 74 between each device holder, the 8 mm dimension extends along a radius of the disk. The slots 72 are in a spiral pattern with the mean radius of each slot being 8 mm smaller than the next innermost slot.

Figure 8:
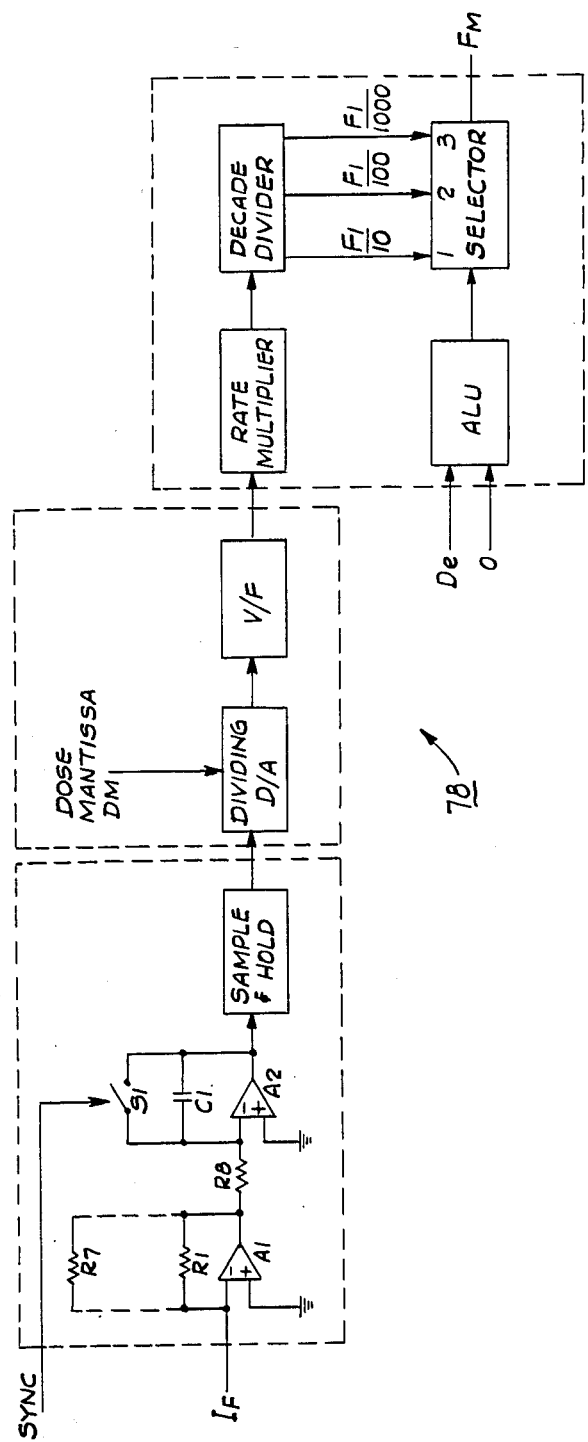
FIG. 8 is schematic of a circuit for analyzing beam intensity information from the Faraday cage.

The beam intensity through each slot is an accurate measure of the beam intensity in an 8 mm×2 mm area at the corresponding radius of the workpiece. The average intensity of the beam per revolution $I_F$ measured by a Faraday cage 76 is used in a control circuit 78 to control the transverse velocity $v_Y$ imparted to the disk by the motor 70 to obtain a uniform implant. The control circuit 78 is essentially identical, in operating parameters, to that of Ryding, U.S. Pat. No. 4,234,797. A schematic block diagram of the control circuit 78 is shown in FIG. 8. $I_F$ in that figure is the average current as exemplified by FIG. 4C. $F_M$ is the signal sent to control the motor 70 which determines the translational velocity $v_Y$. Measurements of the beam intensity through one of the slots in the spiral are preferably taken every 6 msec, 13 times more often than with a single slit of U.S. Pat. No. 4,234,797. The increase in the measuring resolution gives greater flexibility and inherent accuracy to the control of the beam implantation dose.

The invention does not depend on the particular beam detector used. Under some circumstances it may be appropriate to use a solid state detector, or a proportional counter, or a detector of neutral beams, or a calorimeter or a mass spectrometer, or a device to measure momentum transfer.

The holes, pattern and shape may also be made closer according to the need. Thus, the holes may be circular or rectangular or wedge shaped or arcs of circles. Since the ion beams are stopped in thicknesses much less than a thousand of an inch, it is appropriate to use thin material to minimize slit scattering.

While the present invention has been described with a degree of particularity, it should be appreciated that it is the intent that the invention include all modifications and/or alterations falling within the spirit or scope of the appended claims.

I claim:

1. A system for treating a workpiece by directing a beam of particles at the workpiece, comprising:
a support having means for mounting said workpiece for rotation through the beam to cause particles to impinge upon the workpiece, said support defining a plurality of apertures at different distances from a support axis of rotation to allow particles from said beam to pass through said support;
detector means for measuring the intensity of particles passing through the apertures in said support; and
drive means for moving said support relative to said beam to cause said beam to be directed at different regions of said support and to pass through different ones of said plurality of apertures.

2. The system of claim 1 wherein support comprises means for mounting plural wafers for ion implantation by the beam and said apertures define a spiral pattern in said support at locations between the wafers so said apertures intercept the beam during an ion implantation sequence.

3. The system of claim 2 wherein the drive means for moving comprises a drive responsive to the means for measuring to assure a uniform fluence of particles impinges upon the wafers during an implantation sequence.

4. The apparatus of claim 1 wherein the detector means comprises means for measuring a current from a beam of charged particles passing through said apertures.

5. The apparatus of claim 4 wherein the detecting means comprises a Faraday cage.

6. The apparatus of claim 2 wherein the support comprises thin tungsten sheets that define the aperture locations.

7. In a particle treatment system, a method for determining particle beam intensity comprising the steps of:
directing a beam of particles at a workpiece support having a plurality of openings at different radial positions about a support axis of rotation;
rotating said support at a controlled rate as the beam impinges on the support so that the beam passes through at least some of the openings; and
measuring the intensity of the beam after it passes through the one or more openings to obtain a measure of beam intensity at said radial positions.

8. The method of claim 7 comprising the additional step of translating the support relative the beam in a controlled manner to cause said beam to impinge upon workpieces mounted to said support between the position of said holes to produce a uniform particle fluence on the workpieces.

9. The method of claim 8, wherein the particles are charged and the workpieces are semiconductor wafers to be doped.

10. The method of claim 8 wherein the workpieces are generally circular and the openings are positioned to spiral around the support between the position of said generally circular workpieces.

11. A system for determining an intensity of a beam of particles comprising:
a beam interrupting means mounted for rotation through the beam, said interrupting means defining a plurality of apertures at different distances from an axis of rotation to allow particles from said beam to pass through said interrupting means;
detector means for measuring the intensity of particles passing through the apertures in said beam interrupting means; and
control means for adjusting the beam to achieve a desired particle intensity distribution in said beam.

12. The system of claim 11 wherein said interrupting means comprises means for mounting a plurality of wafers for ion implantation by the beam and said apertures define a spiral pattern in said means for mounting at locations between the wafers so said apertures intercept the beam during an ion implantation sequence.

13. The system of claim 12 additionally comprising drive means for moving said means for mounting, said drive means responsive to the detector means to assure a uniform fluence of particles impinges upon the wafers during an implantation sequence.

14. The apparatus of claim 13 wherein the detector means comprises means for measuring a current from a beam of charged particles passing through said apertures.

* * * * *